US012568729B2

(12) United States Patent
Asozu

(10) Patent No.: US 12,568,729 B2
(45) Date of Patent: Mar. 3, 2026

(54) ORGANIC PHOTODIODE DEVICE

(71) Applicant: Magnolia White Corporation, Tokyo (JP)

(72) Inventor: Genki Asozu, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 548 days.

(21) Appl. No.: 18/121,085

(22) Filed: Mar. 14, 2023

(65) Prior Publication Data

US 2023/0301124 A1     Sep. 21, 2023

(30) Foreign Application Priority Data

Mar. 17, 2022     (JP) ................................. 2022-042520

(51) Int. Cl.
*H10K 30/88*          (2023.01)
*H10K 30/82*          (2023.01)
*H10K 39/32*          (2023.01)

(52) U.S. Cl.
CPC ............. *H10K 30/88* (2023.02); *H10K 30/82* (2023.02); *H10K 39/32* (2023.02)

(58) Field of Classification Search
CPC ........ H10K 30/82; H10K 30/88; H10K 39/30; H10K 39/32; H10K 39/38; H10K 59/82; H10K 59/87–8723; H10F 39/811
See application file for complete search history.

(56) References Cited

U.S. PATENT DOCUMENTS

2009/0027358 A1     1/2009   Hosono
2015/0041781 A1*    2/2015   Hatano ................... H10F 55/00
                                                             438/82

FOREIGN PATENT DOCUMENTS

JP          2009-032005 A      2/2009

* cited by examiner

*Primary Examiner* — Daniel P Shook
(74) *Attorney, Agent, or Firm* — XSENSUS LLP

(57)          ABSTRACT
Provided is an organic photodiode device including at least one photodiode including a first organic layer between a first electrode and a second electrode, a bank covering an edge of the first electrode, and a rib surrounding the first organic layer. The second electrode covers the rib. The organic photodiode device further includes a common electrode connected to the second electrode, and the rib may be located between the common electrode and the first organic layer. The first organic layer may include a polymer compound. The at least one photodiode includes a plurality of photodiodes, and the first organic layer may be shared by the plurality of photodiodes.

20 Claims, 9 Drawing Sheets

ORGANIC PHOTODIODE DEVICE

CROSS-REFERENCE TO RELATED APPLICATIONS

This application claims the benefit of priority to Japanese Patent Application No. 2022-042520, filed on Mar. 17, 2022, the entire contents of which are incorporated herein by reference.

FIELD

One embodiment of the present invention relates to an organic photodiode device.

BACKGROUND

Photodiodes are known as a type of optical sensor and an organic photodiode in which an organic compound is used for an active layer is known as one of the photodiodes (Japanese Laid-Open Patent Publication No. 2009-32005).

SUMMARY

An organic photodiode device according to an embodiment of the present invention includes at least one photodiode including a first organic layer between a first electrode and a second electrode, a bank covering an edge of the first electrode, and a rib surrounding the first organic layer. The second electrode covers the rib.

An organic photodiode device according to an embodiment of the present invention includes at least one photodiode including a first organic layer between a first electrode and a second electrode, a bank covering an edge of the first electrode, a rib surrounding the first organic layer, and a partition surrounding the rib. The second electrode is located on the rib.

An organic photodiode device according to an embodiment of the present invention includes at least one photodiode including a first organic layer between a first electrode and a second electrode, a bank covering an edge of the first electrode, a first rib surrounding the first organic layer, and a second rib surrounding the first rib. The second electrode covers the second rib.

BRIEF DESCRIPTION OF DRAWINGS

FIG. 4 is a schematic cross-sectional view of an organic photodiode device according to an embodiment of the present invention.

FIG. 5 is a schematic cross-sectional view of an organic photodiode device according to an embodiment of the present invention.

DESCRIPTION OF EMBODIMENTS

Figure 1:
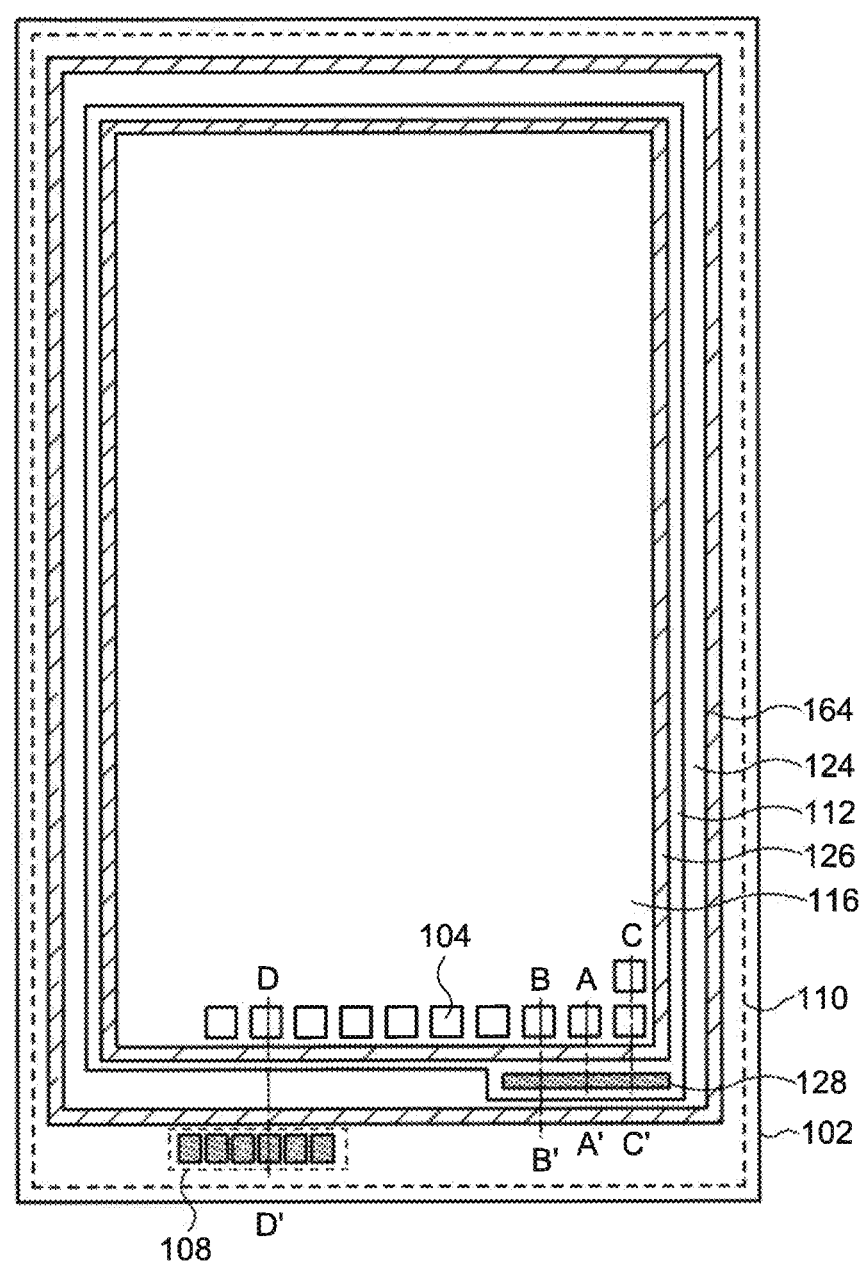
FIG. 1 is a schematic top view of an organic photodiode device according to an embodiment of the present invention.

An object of one embodiment of the present invention is to provide an organic photodiode device having a novel structure and a method for fabricating the organic photodiode device. Another object is to simplify the manufacturing process of the organic photodiode device.

Hereinafter, embodiments of the present invention will be described with reference to the drawings and the like. However, the present invention can be implemented in various aspects without departing from the gist thereof, and is not to be construed as being limited to the description of the embodiments exemplified below.

In the drawings, although widths, thicknesses, shapes, and the like of the respective portions may be schematically represented in comparison with the actual embodiments for clarity of explanation, the drawings are merely examples, and do not limit the interpretation of the present invention. In the present specification and the drawings, elements having the same functions as those described with respect to the drawings described above are denoted by the same reference numerals, and redundant descriptions thereof may be omitted.

In the present specification and claims, in the case where a single film is processed to form a plurality of films, the plurality of films may have different functions and roles. However, the plurality of films is derived from films formed as the same layer in the same process, and have the same material. Therefore, the plurality of films is defined as being present in the same layer.

In the present specification and claims, the expression "on" in describing an embodiment of placing another structure on a structure, unless otherwise specified, includes both placing another structure directly above a structure and placing another structure on a structure via yet another structure.

As used herein and in the claims, the phrase "a structure is exposed from another structure" means that a portion of a structure is not covered by another structure, and the portion that is not covered by the other structure also includes aspects that are covered by yet another structure.

First Embodiment

1. Overall Configuration

In this embodiment, a structure of an organic photodiode device 100 according to an embodiment is described. As shown in FIG. 1, the organic photodiode device 100 has a substrate 102 on which a plurality of photodiodes 104 are provided. The photodiodes 104 are arranged in a matrix having a plurality of rows and columns. The organic photodiode device 100 has an area including the plurality of photodiodes 104 (a photodiode area) and a peripheral area surrounding the photodiode area.

Figure 2:
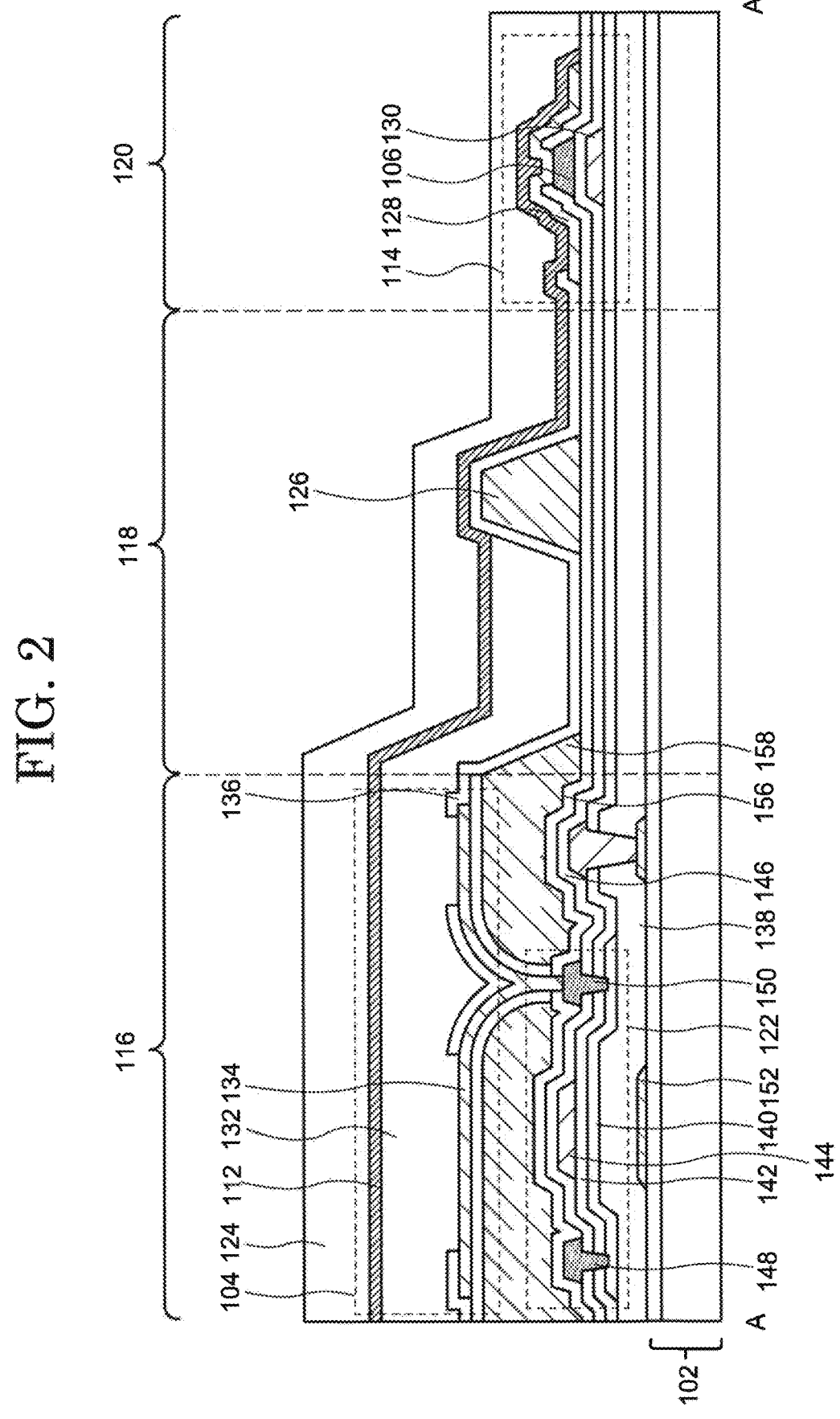
FIG. 2 is a schematic cross-sectional view of an organic photodiode device according to an embodiment of the present invention.

Each of the plurality of photodiodes 104 is provided with a transistor (described later) electrically connected to the photodiode 104. Further, in the peripheral area, for example, as shown in FIG. 1 and FIG. 2, a frame area 118 surrounding the plurality of photodiodes 104 is provided, and a common electrode 106 electrically connected to one of a pair of electrodes, and a mounting electrode 108 electrically connected to the common electrode 106 are further provided outside the photodiode 104. Further, the cut line of a product outline 110 is provided to surround the photodiode area 116 and the mounting electrode 108, and the organic photodiode device 100 can be cut out by trimming along the cut line. Accordingly, a plurality of organic photodiode devices 100 can be fabricated on one mother glass. The mounting electrode 108 is electrically connected to a connector such as a flexible printed circuit (FPC) substrate.

A general function of the organic photodiode device 100 will be described. The plurality of photodiodes 104 generates a current flowing between the pair of electrodes upon absorbing light from the outside. This current is extracted through the transistor, and the current is converted into a voltage, allowing the organic photodiode device 100 to function as an imaging device. In the organic photodiode device 100, as described later, the active layer can be formed of an organic material such as a polymer compound. Therefore, a device having a large area can be provided as compared with a conventional silicon photodiode device.

In the following description, for convenience, a side of the mounting electrode 108 of the organic photodiode device 100 is referred to as a lower portion and a side opposite to the mounting electrode 108 is defined as an upper portion. In the case where the substrate 102 and the organic photodiode device 100 can be regarded as a quadrangle mainly composed of four sides, the side on the mounting electrode 108 side is referred to as a bottom side, the side opposite to the mounting electrode 108 is referred to as an upper side, and the sides between the upper side and the bottom side are referred to as a left and right side.

Peripheral Area

2. Cross-Sectional Structure-1

FIG. 2 is a schematic cross-sectional view taken along a chain line A-A' shown in FIG. 1. The figure shows a contact area 114 of the common electrode 106 and the upper electrode 112 and a part of the photodiode 104 proximate thereto.

As shown in FIG. 2, the photodiode area 116 which is an area including the plurality of photodiodes 104, and the frame area 118 and a common electrode area 120 that constitute a peripheral area are provided on the substrate 102, and the frame area 118 is located between the photodiode area 116 and the common electrode area 120.

In the photodiode area 116, the photodiode 104, a transistor 122 electrically connected to the photodiode 104, and a sealing film 124, and the like are provided. The frame area 118 is provided with a rib 126 and the sealing film 124, and the like. In the common electrode area 120, the upper electrode 112, the common electrode 106, a contact pad 128, a wiring 130 connected to the common electrode 106 and the sealing film 124, and the like are provided. The sealing film 124 described above is shared by the photodiode area 116, the frame area 118, and the common electrode area 120. In addition, the upper electrode 112 can be electrically connected to the wiring 130 via the common electrode 106. The photodiode area 116 is provided on a center side of the substrate 102, and the common electrode area 120 is provided on a substrate edge side. That is, as shown in FIG. 1, the photodiode area 116 is surrounded by the frame area 118 sandwiched between the photodiode area 116 and the common electrode area 120. Since the rib 126 is provided in the frame area 118, an outer periphery of the area surrounded by the rib 126 is longer than a periphery of the photodiode area 116 located inside, and the area surrounded by the rib 126 is larger than the photodiode area 116.

The photodiode 104 includes the pair of electrodes and an organic layer 132 sandwiched between the pair of electrodes. As described above, the upper electrode 112, which is one of the pair of electrodes, is connected to the contact pad 128 of the common electrode 106 and is electrically connected to the common electrode 106. A bottom electrode 134, which is the other of the pair of electrodes, is electrically connected to the transistor 122.

The bottom electrode 134 includes a conductive oxide that is transparent to visible light, such as a mixed oxide of indium and tin (ITO) or a mixed oxide of indium and zinc (IZO), a metal such as silver or aluminum, or an alloy of these metals. The bottom electrode 134 may have a single-layer structure or a stacked structure. In the case of a stacked structure, for example, a structure in which a film containing metal is sandwiched by a film containing a conductive oxide such as ITO or IZO can be employed. The contact pad 128 of the common electrode 106 may have a configuration used for the bottom electrode 134.

A bank 136 is provided to cover an edge of the bottom electrode 134. As shown in FIG. 2, although the bottom electrode 134 is in contact with the organic layer 132 at two locations exposed from the bank 136, the number of locations where the bottom electrode 134 is exposed may be, for example, one.

For example, an inorganic compound containing silicon can be used as the bank 136. Inorganic compounds containing silicon include: silicon dioxide including oxygen and silicon: silicon oxynitride and silicon nitride oxide including oxygen, silicon, and nitrogen; and silicon nitride including silicon and silicon nitrogen. Further, a metal oxide such as aluminum oxide can be used. It is possible to prevent moisture from entering the photodiode 104 from a hygroscopic film such as the rib 126 or a planarization film 158 by using such materials for the bank 136. Further, these films may have a single-layer structure, may have a stacked structure, and may preferably have a film thickness of about 20 nm to 100 nm.

The organic layer 132 is provided to cover the bottom electrode 134 and the bank 136 covering the edge of the bottom electrode 134. Here, the organic layer 132 refers to the entire layer provided between the pair of electrodes. The organic layer 132 may be composed of a plurality of layers. The organic layer 132 can be formed by combining various functional layers such as a hole transport layer, an active layer, and an electron transport layer. In the case where stacked structures of the hole transport layer, the active layer, and the electron transport layer are employed, the active layer is disposed to be sandwiched between the hole transport layer and the electron transport layer. At this time, the active layer may be disposed on the side of the bottom electrode 134 or may be disposed on the side of the upper electrode 112. The organic layer 132 may alternatively consist only of an active layer. All the photodiodes 104 included in the organic photodiode device 100 may have the organic layer 132 having the same structure.

The active layer includes a polymer compound. The polymer compound is dissolved in a solvent, and then the obtained solution is applied by a coating method such as an ink jet method or a spin coating method. As the solvent for dissolving the polymer compound, it is only necessary to dissolve or suspend the polymer compound. The active layer is formed to have an area equal to or larger than the area of the bottom electrode 134. In addition, since the active layer is formed on the bottom electrode 134 by the coating method, the active layer protrudes from the photodiode area 116 and extends to the frame area 118. At this time, since the solution containing the polymer compound is dammed by the rib 126 located in the frame area 118, the solution does not cover the entire rib 126 over the rib 126 but partially covers the rib 126. As a result, the organic layer 132 is selectively provided inside the rib 126.

The active layer may further include a low molecular weight compound. In the case where the active layer includes the low molecular compound, the active layer can be formed by dispersing or dissolving the low molecular compound in a solution in which the polymer is dissolved, and applying the dispersion liquid or the solution. A mixture or a composite material in which a plurality of polymer compounds is mixed can also be used as the active layer. In the case where two or more kinds of materials are mixed and used in the active layer, an electron-accepting material (an acceptor material) and an electron-donating material (a donor material) can be combined with the polymer compound.

A p-type organic semiconductor or an n-type organic semiconductor can be used as the polymer compound used for the active layer. For example, poly((2,5-bis(2-hexyl-decyl)-2,3,5,6-tetrahydro-3,6-dioxopyrrolo(3,4-c)pyrrole-1, 4-diyl)-alt-(3',3"-dimethyl-2,2':    5',2"-terthiophene)-5,5"-diyl) (PMDPP3T) or the like can be used as the p-type organic semiconductor. For example, [6,6]-phenyl C61-butyric acid methyl ester (PC61BM) or the like can be used as the n-type organic semiconductor. A film thickness of the active layer is preferably 100 nm to 500 nm, and more preferably about 350 nm.

For example, a material capable of forming a film by application of poly(3,4-ethylenedioxythiophene) (PEDOT: PSS) doped with poly(4-styrene sulfonate) or the like can be used as the hole transporting layer. In addition, an amine compound can be used for the hole transport layer, and materials such as polyaniline and polyethyleneimine can be used. Further, a film may be formed by a film forming method such as vapor deposition or sputtering of tungsten oxide ($WO_3$), molybdenum oxide, or the like.

For example, materials capable of forming films by coating a polymer compound such as ethoxylated polyethylene-imine (PEIE) and polyethyleneimine (PEI), zinc acetate, or the like can be used as the electron-transporting layer. In addition, materials capable of forming films by a thin film formation method such as deposition or sputtering of a metal oxide can be used, and for example, zinc oxide (ZnO), titanium oxide ($TiO_2$), or the like can be used. The electron-transporting layer has a single-layer structure, and a film thickness may be up to about 30 nm.

The upper electrode 112 is formed on the plurality of photodiodes 104. That is, the plurality of photodiodes 104 share the upper electrode 112. Further, the upper electrode 112 is formed across the frame area 118 and the common electrode area 120 and is provided on the common electrode 106 as described above.

The upper electrode 112 includes, for example, a light-transmitting conductive oxide such as ITO or IZO, a metal such as aluminum, magnesium, or silver, or an alloy containing one or more of these metals. In the case where the active layer receives light from the outside through the bottom electrode 134, the bottom electrode 134 is formed to include a conductive oxide, and the upper electrode 112 is formed using a metal having a high reflectance with respect to visible light, such as aluminum, silver, or gold. On the other hand, in the case where the active layer receives light from the outside through the upper electrode 112, the bottom electrode 134 is formed to include a metal having a high reflectance to visible light, such as aluminum, silver, or gold, and the upper electrode 112 is formed to be transparent to visible light. Specifically, the upper electrode 112 may be formed of a film containing a conductive oxide such as ITO or IZO, or a metal thin film containing a metal such as silver, magnesium, or aluminum and having a thickness that allows visible light to pass therethrough.

The common electrode 106 is provided outside the rib 126 with respect to the photodiode 104. As described above, the common electrode 106 may be electrically connected to the upper electrode 112 via the contact pad 128. By providing the contact pad 128, the contact area between the upper electrode 112 and the contact pad 128 is increased, and an increase in the contact resistance between the common electrode 106 and the upper electrode 112 can be suppressed. Further, by covering at least an edge of the contact pad 128 located between the rib 126 and the common electrode 106 with a third interlayer film described later, it is possible to prevent the step breakage of the upper electrode 112 and the contact pad 128. Alternatively, a first interlayer 146 (described later) or the bank 136 covering the transistor 122 may cover the edge of the contact pad 128. Further, the common electrode 106 is electrically connected to the mounting electrode 108. The common electrode 106 and the mounting electrode 108 can be electrically connected to each other via, for example, the wiring 130. The common electrode 106 and the wiring 130 are connected to each other via an opening (not shown in FIG. 2).

The common electrode 106 and the wiring 130 are configured to include titanium, molybdenum, tungsten, tantalum, aluminum, copper, or an alloy thereof. These electrodes may be configured to have a structure in which a metal having high conductivity such as aluminum or copper is sandwiched between refractory metals such as titanium, molybdenum, tungsten, and tantalum.

The contact pad 128 may be formed simultaneously with the bottom electrode 134, and these items may be present in the same layer. The contact pad 128 is configured to include a conductive oxide such as ITO or IZO, or a metallic material such as titanium, tungsten, molybdenum, tantalum, or aluminum.

The rib 126 is provided in the frame area 118 and is located between the photodiode 104 and the common electrode 106. Further, the rib 126 is also located between the organic layer 132 of the photodiode 104 and the common electrode 106. As shown in FIG. 1, since the frame area 118 is provided to surround the photodiode area 116, the rib 126 provided in the frame area 118 is provided to surround the photodiode area 116. As described above, the organic layer 132 between the pair of electrodes of the photodiode 104 covers the bottom electrode 134 and extends to the frame area 118. The ribs 126 located in the frame area 118 dam the organic layer 132 and prevent the organic layer 132 from extending to the contact pads 128 of the common electrode 106. That is, the spread of the solution containing the organic layer 132 supplied by the coating method can be controlled, and the organic layer 132 can be selectively formed inside the rib 126. As a result, the organic layer 132 can be prevented from being formed on the common electrode 106 and the contact pad 128. Therefore, a process for exposing the contact pad 128 from the organic layer 132 is unnecessary, which contributes to simplification of the manufacturing process of the organic photodiode device 100.

As will be described later, the rib 126 can be formed in the same process as the planarization film 158 described later. Therefore, the rib 126 and the planarization film 158 may be present in the same layer, have the same composition, and include the same organic compound. Here, as shown in FIG. 2, the rib 126 is covered with the bank 136 which is an inorganic film. As a result, the rib 126 can be formed in the same process as the bank 136 and can be present in the same layer. Further, the bank 136 may be provided in contact with a third interlayer 156 described later. As a result, the rib 126 can be prevented from touching the solution in which the polymer compound is dissolved at the time of forming the organic layer 132, and the rib 126 can be prevented from swelling and deforming.

The upper electrode 112 of the photodiode 104 is provided on the organic layer 132 and also extends on the rib 126 to cover the rib 126. Further, the upper electrode 112 is formed to extend on the common electrode 106. As described above, the contact pad 128 is not covered by the organic layer 132 because the rib 126 dams the organic layer 132 and the organic layer 132 is formed inside the rib 126. Therefore, the upper electrode 112 is directly connected to the contact pad 128 without the step of exposing the contact pad 128 from the organic layer 132. Alternatively, in the case where the contact pad 128 is not provided, the upper electrode 112 is directly connected to the common electrode 106.

The transistor 122 and the photodiode 104, and the like are provided on the substrate 102 via an under coat 138 (a second interlayer 154). The substrate 102 has a function of supporting the transistor 122 and the photodiode 104, and the like formed thereon, and may include glass, quartz, or a polymer. The substrate 102 may also have a stacked structure including these materials. FIG. 2 shows an example in which the substrate 102 has a two-layer structure. Flexibility can be imparted to the organic photodiode device 100, and a so-called flexible organic photodiode device can be provided by using a polymer material such as a polyimide, a polyamide, or a polycarbonate for the substrate 102.

For example, an inorganic compound containing silicon can be used as the under coat 138. Inorganic compounds containing silicon include: silicon dioxide including oxygen and silicon; silicon oxynitride and silicon nitride oxide including oxygen, silicon, and nitrogen; and silicon nitride including silicon and silicon nitrogen. These films may have a single-layer structure or a stacked structure.

The transistor 122 includes a semiconductor layer 140, a gate insulating layer 142 on the semiconductor layer 140, a gate electrode 144 on the gate insulating layer 142, a first interlayer 146 on the gate electrode 144, a drain electrode 148 on the first interlayer 146, and a source electrode 150, and the like. In FIG. 2, the transistor 122 is shown as a transistor having a top-gate structure. However, the structure of the transistor electrically connected to the photodiode 104 is not limited, and transistors having various structures can be used.

The gate electrode 144, the drain electrode 148, and the source electrode 150 are configured to include titanium, molybdenum, tungsten, tantalum, aluminum, copper, or an alloy thereof. These electrodes may be configured to have a structure in which a metal having high conductivity such as aluminum or copper is sandwiched between refractory metals such as titanium, molybdenum, tungsten, and tantalum.

The semiconductor layer 140 is structured by, for example, polysilicon, microcrystalline oxide semiconductor, amorphous oxide semiconductor, or low-temperature polysilicon, or the like.

A conductive film 152 overlapping the semiconductor layer 140 may be provided between the semiconductor layer 140 and the substrate 102. The conductive film 152 can have the function of an electrode, a light-shielding film, or both.

In the case of forming the conductive film 152, the second interlayer 154 is provided on the conductive film 152, and the transistor 122 is provided on the second interlayer 154.

The third interlayer 156 and the planarization film 158 thereon are provided on the transistor 122. The third interlayer 156 is provided to prevent an impurity from entering an element such as the transistor 122. The planarization film 158 absorbs irregularities caused by the transistor 122 or the like and forms a flat surface.

An opening reaching the source electrode 150 is provided in the planarization film 158 and the third interlayer 156. The transistor 122 and the photodiode 104 are electrically or directly connected to each other through the opening. The transistor 122 and the photodiode 104 may be connected to each other via the drain electrode 148. A fourth interlayer 160 is provided to cover the planarization film 158. Further, by providing the fourth interlayer 160 in contact with the third interlayer 156, the upper electrode 112 is provided without being in contact with the planarization film 158. Although not shown, the fourth interlayer 160 may be provided with an opening for allowing contact between the bank 136 and the planarization film 158. Impurities contained in the planarization film 158 can be discharged by providing the opening. The fourth interlayer 160 and the opening for allowing contact between the bank 136 and the planarization film 158 are arbitrarily formed.

For example, an inorganic compound containing silicon can be used for the gate insulating layer 142, the first interlayer 146, the second interlayer 154, the third interlayer 156, and the fourth interlayer 160. Inorganic compounds containing silicon include: silicon dioxide including oxygen and silicon; silicon oxynitride and silicon nitride oxide including oxygen, silicon, and nitrogen; and silicon nitride including silicon and silicon nitrogen. These films may have a single-layer structure or a stacked structure.

The planarization film 158 includes an organic compound. Exemplary organic compounds include acrylic resins, epoxy resins, polysiloxane resins, polyimide resins, and polyamide resins, and the like.

The planarization film 158 and the rib 126 may be formed in the same process. In the subsequent manufacturing process, the photodiode 104 and the rib 126 are formed, so that the organic layer 132 of the photodiode 104 does not cover the common electrode 106, as described above. As a result, the manufacturing process of the organic photodiode device 100 can be simplified as described above, and the manufacturing cost can also be reduced. The planarization film 158 and the rib 126 may be present in the same layer, have the same material, and contain the same organic compound by forming the planarization film 158 and the rib 126 in the same process.

The sealing film 124 may be provided on and cover the photodiode 104, the rib 126, and the common electrode 106. A structure of the sealing film 124 can be arbitrarily selected, and a single-layer structure or a stacked structure can be applied. FIG. 2 shows an example of a single-layer structure in which an organic compound is used for the sealing film 124. For example, a stacked structure having a first inorganic layer containing an inorganic compound, an organic layer containing an organic compound, and a second inorganic layer containing an inorganic compound can be applied for the sealing film. In this case, the inorganic compound containing silicon described above can be used as the inorganic compound. A polymer compound such as an epoxy resin or an acrylic resin can be used as the organic compound.

Although not shown, an optical adjustment member such as a color filter or a collimator may be provided in a layer on the sealing film 124.

3. Cross-Sectional Structure-2

Figure 3:
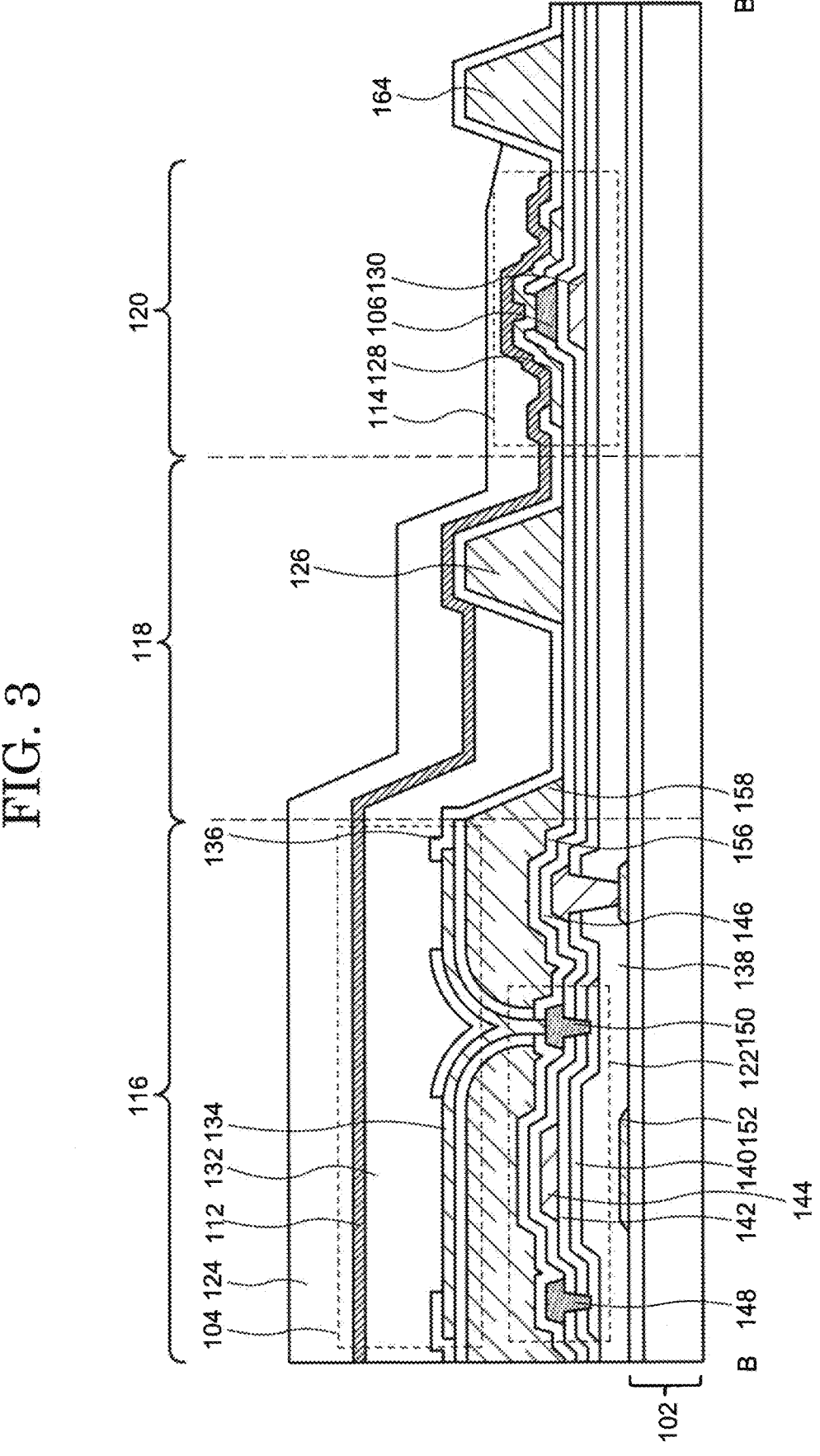
FIG. 3 is a schematic cross-sectional view of an organic photodiode device according to an embodiment of the present invention.

FIG. 3 shows the bottom side of the organic photodiode device 100 and shows a schematic cross-sectional view along a chain line B-B' shown in FIG. 1. The figure shows the contact area 114 of the common electrode 106 and the upper electrode 112, a partition 164, and a portion of the photodiode adjacent thereto. Hereinafter, the same or similar configurations as those of the schematic cross-sectional view (FIG. 2) taken along the chain line A-A' shown in FIG. 1 may be omitted.

As shown in FIG. 3, the photodiode area 116, the frame area 118, and the common electrode area 120 are provided on the substrate 102. Each area has the same or similar configuration as each area shown in FIG. 2. Specifically, the sealing film 124 is formed on the photodiode 104, the rib 126, and the common electrode 106. That is, the sealing film 124 covers the photodiode area 116, the frame area 118, and the common electrode area 120, and is formed to cover these areas as shown in FIG. 1. The partition 164 is further provided on an edge side of the substrate of the common electrode area 120, and the common electrode 106 is provided between the partition 164 and the rib 126. The sealing film 124 may be provided inside the partition 164, may cover the upper electrode 112, and may further cover the common electrode 106.

The rib 126 located in the frame area 118 dams the organic layer 132 and prevents the organic layer 132 from extending on the common electrode 106 or on the contact pad 128. That is, the spread of the solution containing the organic layer 132 supplied by the coating method can be controlled, and the organic layer 132 can be selectively formed inside the rib 126. As a result, the organic layer 132 can be prevented from being formed on the common electrode 106. Therefore, a process for exposing the contact pad 128 from the organic layer 132 is unnecessary, which contributes to simplification of a manufacturing process of the organic photodiode device 100.

The partition 164 may be formed in the same process as the planarization film 158 and the rib 126. Accordingly, the partition 164 may be present in the same layer as the planarization film 158 and the rib 126, have the same composition, and contain the same organic compound. Therefore, the partition 164 is provided before forming the sealing film 124.

Similar to the configuration shown in FIG. 2, an example in which the sealing film 124 contains an organic compound is shown. The sealing film 124 can be formed using, for example, a polymer compound which is an organic compound. In the case where a polymer compound is used for the sealing film 124, for example, the sealing film 124 can be formed by a coating method such as a spin coating method, a dip coating method, an ink jet method, or a printing method. As described above, since the partition 164 is already provided at the time of forming the sealing film 124, the solution containing the polymer compound that provides the sealing film 124 is dammed by the partition 164 and can be selectively formed inside the partition 164, and the organic layer 132 and the upper electrode 112 can be securely sealed. The sealing film 124 may partially cover the partition 164. In addition, the sealing film 124 may cover the upper electrode 112 and an edge thereof.

4. Cross-Sectional Structure-3

Figure 4:
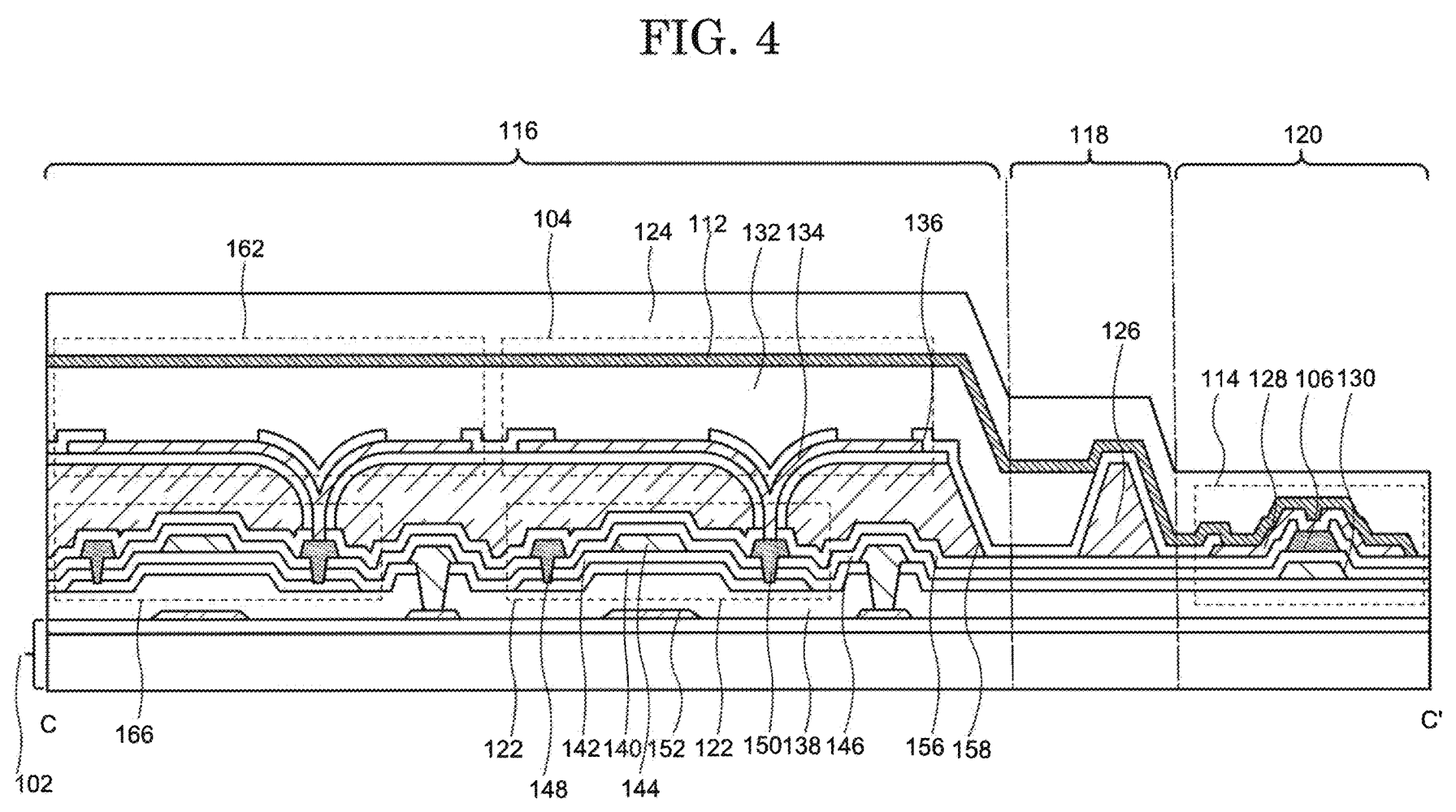

FIG. 4 shows the bottom side of the organic photodiode device 100 and shows a schematic cross-sectional view along a chain line C-C' shown in FIG. 1. The figure shows the contact area 114 of the common electrode 106 and the upper electrode 112 and a portion of the plurality of photodiodes proximate thereto. Hereinafter, the same or similar configurations as those of the schematic cross-sectional view (FIG. 2) taken along the chain line A-A' shown in FIG. 1 may be omitted.

As shown in FIG. 4, the photodiode area 116, the frame area 118, and the common electrode area 120 are provided on the substrate 102. Each area has the same or similar configuration as each area shown in FIG. 2.

As shown in FIG. 4, a photodiode 162 and a transistor 166 are provided on the substrate 102. The photodiode 162 is electrically connected to the transistor 166. The photodiode 162 and the photodiode 104 share the upper electrode 112. The photodiode 162 and the photodiode 104 have the same configuration and share the organic layer 132 and/or the active layer, as described above. The transistor 166 and the transistor 122 have the same or a similar structure.

5. Cross-Sectional Structure-4

Figure 5:
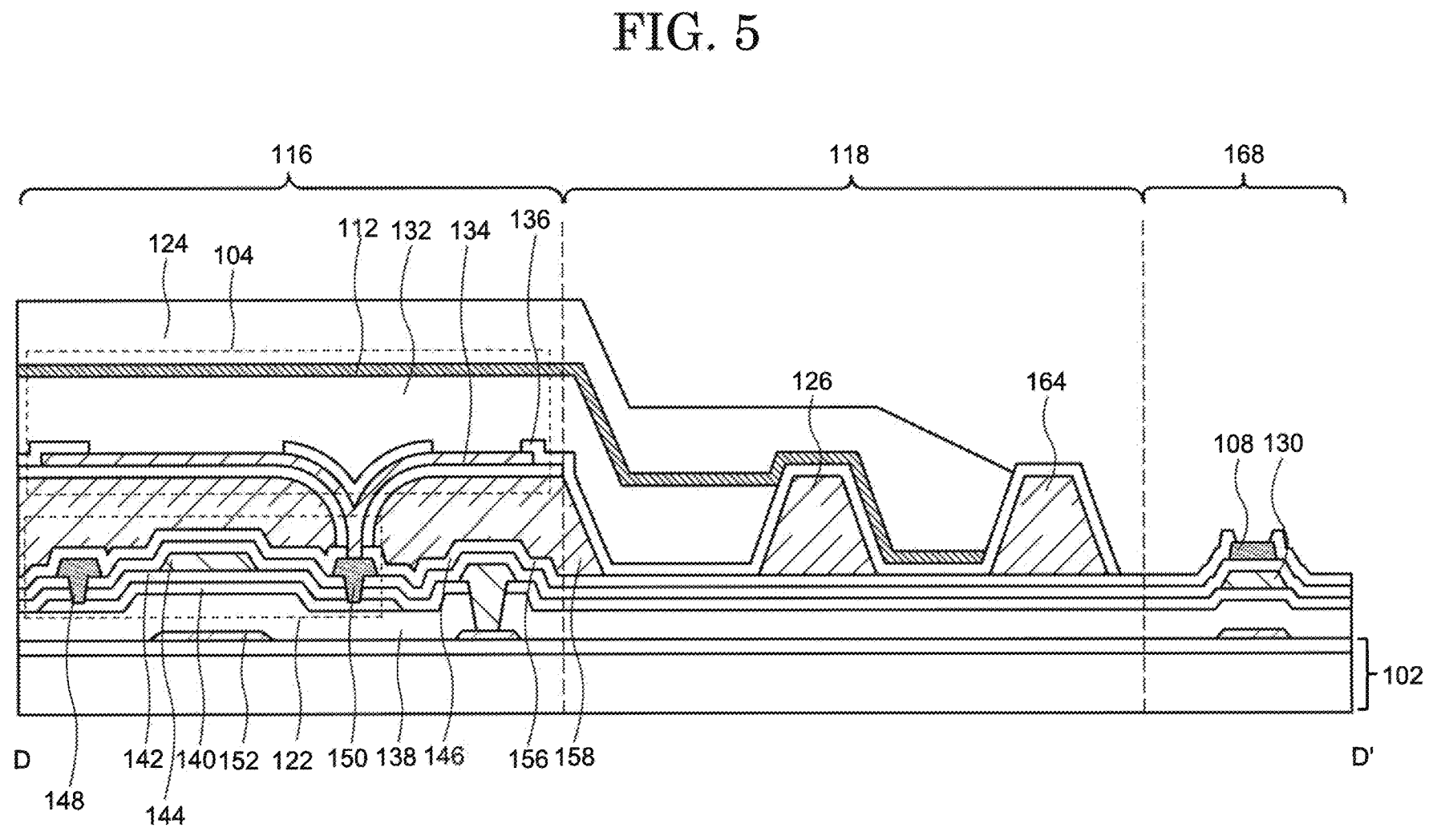

FIG. 5 shows the bottom side of the organic photodiode device 100 and shows a schematic cross-sectional view along a chain line D-D' shown in FIG. 1. The figure shows the mounting electrode 108, the partition 164, and a part of the photodiode 104 proximate thereto. Hereinafter, the same or similar configurations as those of the schematic cross-sectional view (FIG. 2) taken along the chain line A-A' shown in FIG. 1 may be omitted.

As shown in FIG. 5, the photodiode area 116, the frame area 118, and a mounting electrode area 168 are provided on the substrate 102.

The ribs 126 located in the frame area 118 hold the organic layer 132 and prevent the organic layer 132 from extending to the common electrode 106 or the contact pad 128 as described above, and also prevent the organic layer 132 from extending to the mounting electrode 108. That is, the spread of the solution containing the organic layer 132 and supplied by the coating method can be controlled, and the organic layer 132 can be selectively formed inside the rib 126. As a result, the organic layer 132 can be prevented from being formed on the common electrode 106. Therefore, a process for exposing the contact pad 128 and the mounting electrode 108 from the organic layer 132 becomes unnecessary, which contributes to simplification of the manufacturing process of the organic photodiode device 100.

As shown in FIG. 5, the mounting electrode 108 is provided on the substrate 102. The mounting electrode 108 can be electrically connected to the common electrode 106 via the wiring 130. The mounting electrode 108 can be formed simultaneously with the drain electrode 148 and the source electrode 150. As a result, the mounting electrode 108 has the same structure as the drain electrode 148 and the source electrode 150, and can exist in the same layer. The third interlayer 156 may be provided to cover an edge of the mounting electrode 108. The wiring 130 can be formed simultaneously with the gate electrode 144. As a result, the wiring 130 has the same structure as the gate electrode 144 and can exist in the same layer.

The partition 164 is located between the mounting electrode 108 and the rib 126. Since the partition 164 is formed in the same process as the rib 126 as described above, the partition 164 has the same structure as the rib 126 and can be present in the same layer. The sealing film 124 is dammed by partition 164 and is selectively formed inside the partition 164 by forming the partition 164 before forming the sealing film 124. Therefore, the sealing film 124 is not formed on the mounting electrode 108 located on an edge side of the substrate with respect to the partition 164.

In the organic photodiode device 100, the rib 126 protects the common electrode 106 or the contact pad 128 and the mounting electrode 108 from the organic layer 132 of the photodiode 104, and precisely controls the position and the shape of the organic layer 132. Similarly, the partition 164 protects the common electrode 106 or the contact pad 128 from the sealing film 124 of the mounting electrode 108, and precisely controls the position and the shape of the sealing film 124. Therefore, by applying the present embodiment, the number of manufacturing steps of the organic photodiode device 100 can be reduced, and a reliable photodiode with a low cost can also be provided.

Second Embodiment

In the present embodiment, a structure of an organic photodiode device 200 according to an embodiment of the present invention and a manufacturing method thereof will be described. Descriptions of the same or similar configurations to those of the first embodiment will be omitted in some cases.

1. Overall Configuration

Figure 6:
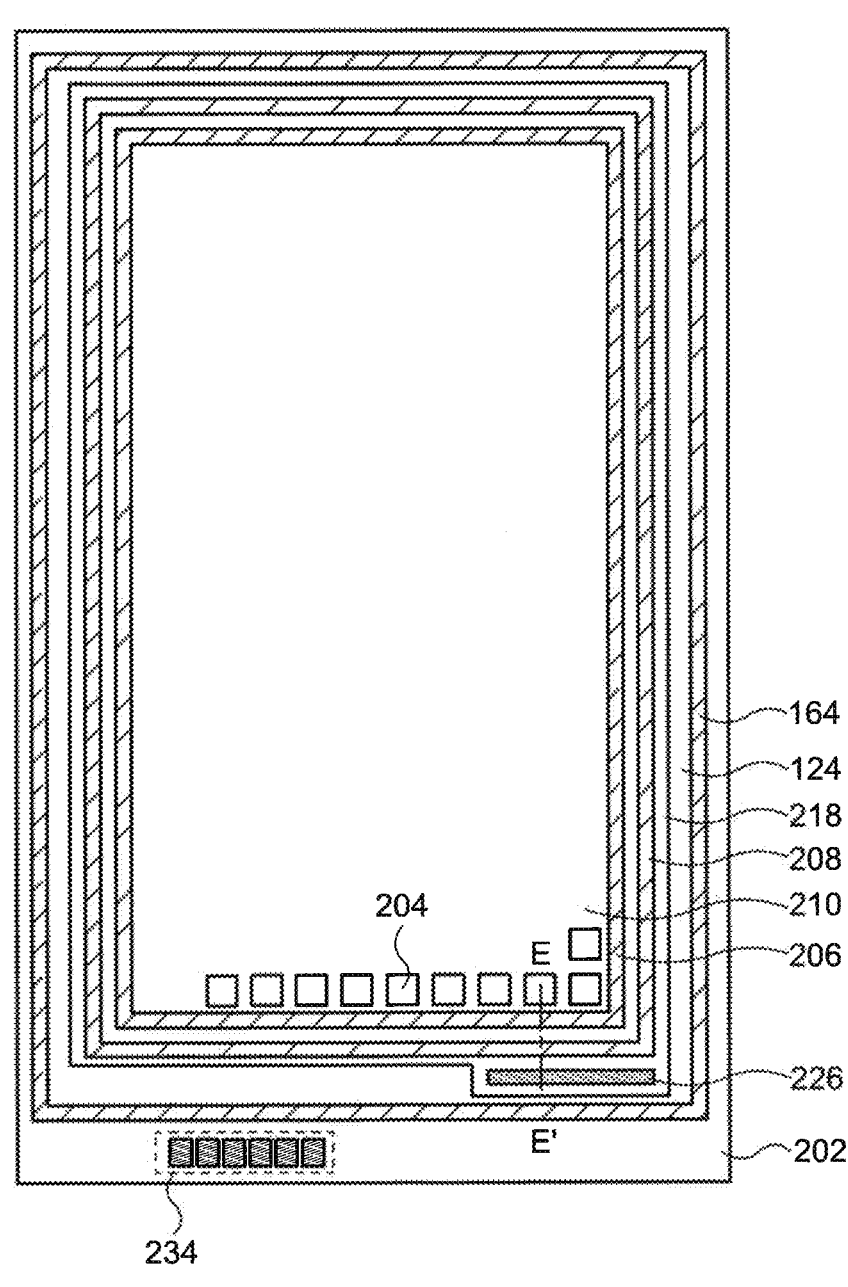
FIG. 6 is a schematic top view of an organic photodiode device according to an embodiment of the present invention.

One difference between the organic photodiode device 200 and the organic photodiode device 100 of the first embodiment is that in the former case, a single rib 126 is provided to surround the photodiode 104. Specifically, as shown in FIG. 6, a plurality of ribs (a first rib 206 and a second rib 208) surround an area including a plurality of photodiodes 204. In addition, one of the plurality of ribs (for example, the second rib 208) surrounds another rib (for example, the first rib 206). Three or more ribs may be provided. Alternatively, the first rib 206 is provided between the plurality of photodiodes 204 and the second rib 208.

More specifically, as shown in FIG. 6, the organic photodiode device 200 has a substrate 202 on which the plurality of photodiodes 204 are provided. The photodiodes 204 are arranged in a matrix having a plurality of rows and columns. The organic photodiode device 200 has an area including the plurality of photodiodes 204 (a photodiode area 210) and a peripheral area surrounding the photodiode area.

2. Peripheral Area 2-1. Cross-Sectional Structure-1 of Organic Layer and Rib

Figure 7:
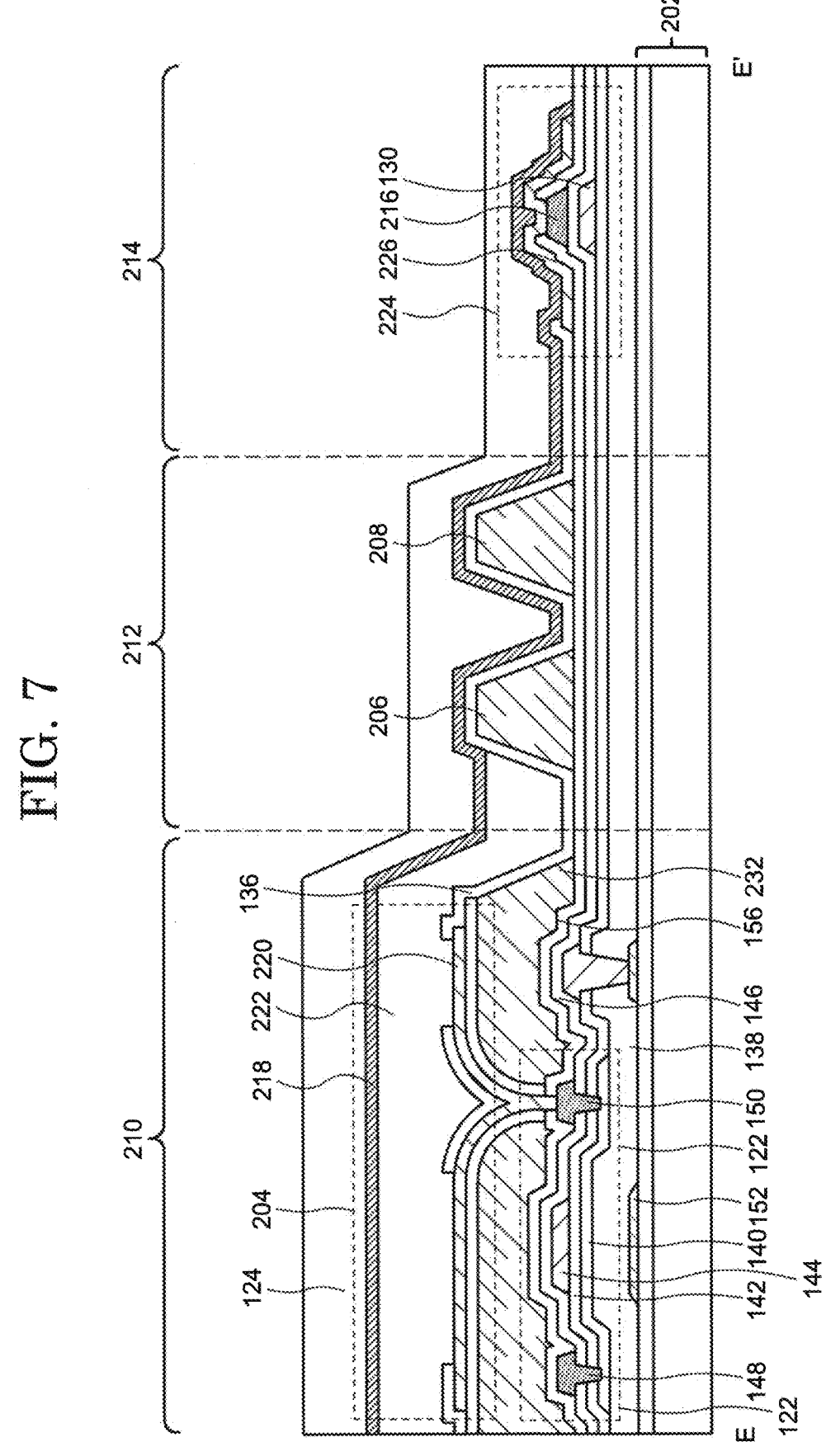
FIG. 7 is a schematic cross-sectional view of an organic photodiode device according to an embodiment of the present invention.

FIG. 7 is a schematic cross-sectional view taken along a chain line E-E' shown in FIG. 6. The figure shows a contact area 224 of a common electrode 216 and an upper electrode 218 and a portion of the photodiode 204 proximate thereto. Further, the organic layer 222 sandwiched between the pair of electrodes of the photodiode 204 is provided inside one of the plurality of ribs.

As shown in FIG. 7, the photodiode area 210, a frame area 212, and a common electrode area 214 are provided on the substrate 202. Each area has a configuration similar to the corresponding configuration shown in FIG. 2. The plurality of ribs is provided in the frame area 212. For example, the first rib 206 is provided between the plurality of photodiodes 204 and the common electrode 216. The second rib 208 is provided between the first rib 206 and the common electrode 216. As described above, since the second rib 208 surrounds the first rib 206, the first rib 206 is provided between the photodiode 204 and the second rib 208 on the four sides of the organic photodiode device 200.

The photodiode 204 has an upper electrode 218 and a bottom electrode 220, and has an organic layer 222 sandwiched between the upper electrode 218 and the bottom electrode 220. The organic layer 222 is provided inside the first rib 206 without overriding the first rib 206. The organic layer 222 partially covers the first rib 206 and is not provided on the first rib 206. Accordingly, a thickness of the organic layer 222 is smaller than a thickness of the first rib 206. The upper electrode 218 is provided on the first rib 206, between the first rib 206 and the second rib 208, on the second rib 208, and on the common electrode 216. Further, the upper electrode 218 covers the first rib 206, an area between the first rib 206 and the second rib 208, the second rib 208, and the common electrode 216.

The first rib 206 located in the frame area 212 holds the organic layer 222 and prevents the organic layer 222 from extending on the common electrode 216 or a contact pad 226 of the common electrode 216. That is, the spread of the solution providing the organic layer 222 and supplied by the coating method can be controlled, and the organic layer 222 can be selectively formed inside the first rib 206. As a result, the organic layer 222 can be prevented from being formed on the common electrode 216. Therefore, a process for exposing the contact pad 226 from the organic layer 222 is unnecessary, which contributes to simplification of the manufacturing process of the organic photodiode device 200.

2-2. Cross-Sectional Structure-2 of Organic Layer and Rib

Figure 8:
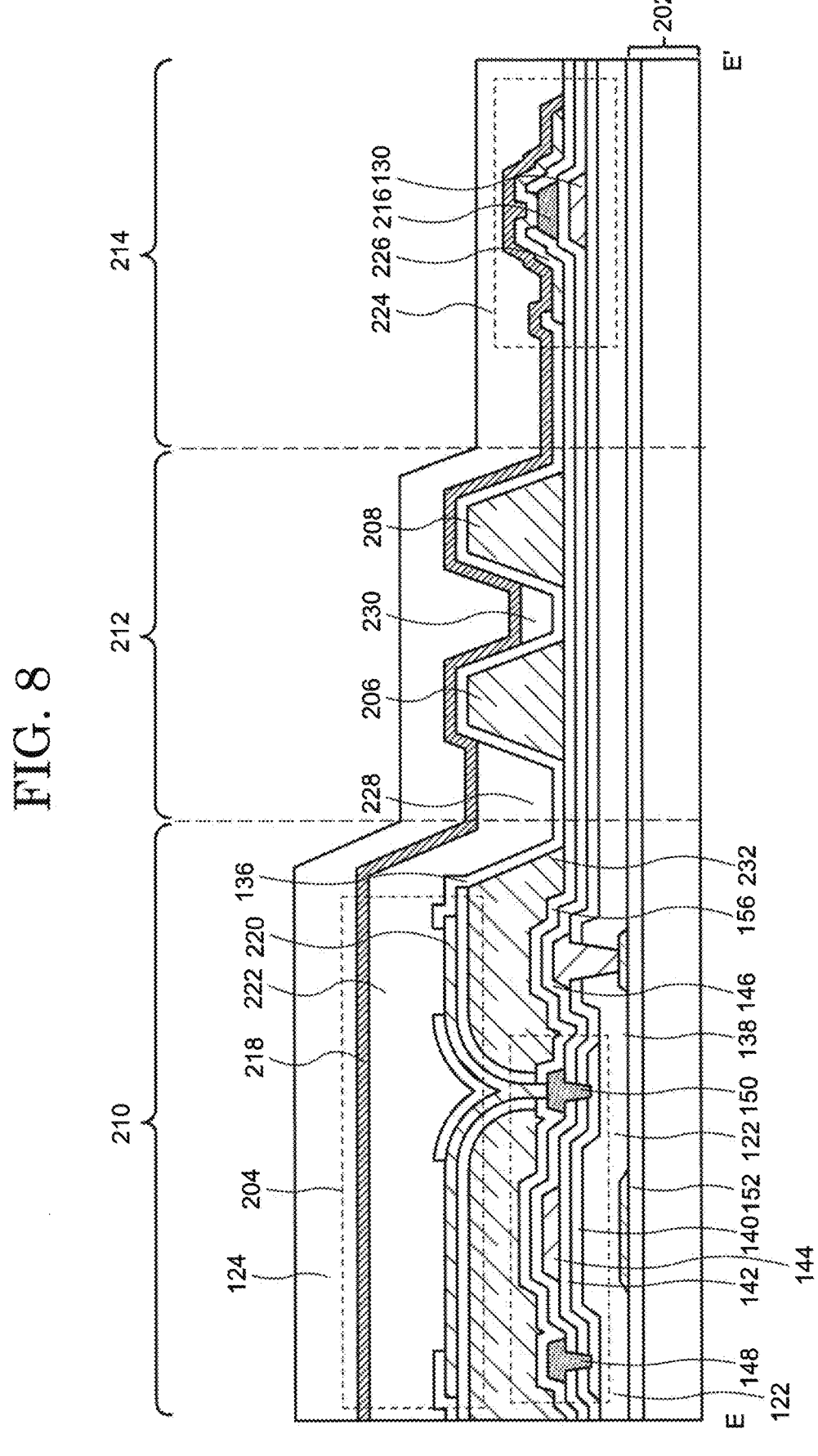
FIG. 8 is a schematic cross-sectional view of an organic photodiode device according to an embodiment of the present invention.

FIG. 8 is a schematic cross-sectional view taken along the chain line E-E' shown in FIG. 6. In FIG. 7, the organic layer 222 is selectively arranged inside the first rib 206, and there is no organic layer 222 between the first rib 206 and the second rib 208. However, the present embodiment is not limited to this configuration, and as shown in FIG. 8, a part of the organic layer 222 may be present between the first rib 206 and the second rib 208 on the first rib 206. In other words, the organic photodiode device 200 may include a first organic layer 228 inside the first rib 206 and a second organic layer 230 between the first rib 206 and the second rib 208. A thickness of the second organic layer 230 may be smaller than a thickness of the first organic layer 228. Even in this case, the first organic layer 228 and the second organic layer 230 are provided inside the second rib 208 and are not provided on the common electrode 216. Further, the upper electrode 218 is provided on the first rib 206 and the second rib 208, and is also provided on the common electrode 216.

By forming the plurality of ribs such as the first rib 206 and the second rib 208 in the frame area 212, even if the organic layer 222 overrides a rib adjacent to the photodiode 204, for example, the first rib 206 shown in FIG. 8, i.e., a rib located outside the rib, for example, the second rib 208 shown in FIG. 8, dams the organic layer 222 and prevents the organic layer 222 from extending to the common electrode 216 and the contact pad 226. That is, the spread of the solution providing the organic layer 222 and supplied by the coating method can be controlled, and the organic layer 222 can be selectively formed inside the second rib 208. As a result, the organic layer 222 can be prevented from being formed on the common electrode 216. Therefore, a process for exposing the contact pad 226 from the organic layer 222 is unnecessary, which contributes to simplification of the manufacturing process of the organic photodiode device 200.

2-3. Cross-Sectional Structure-3 of Organic Layer and Rib

Figure 9:
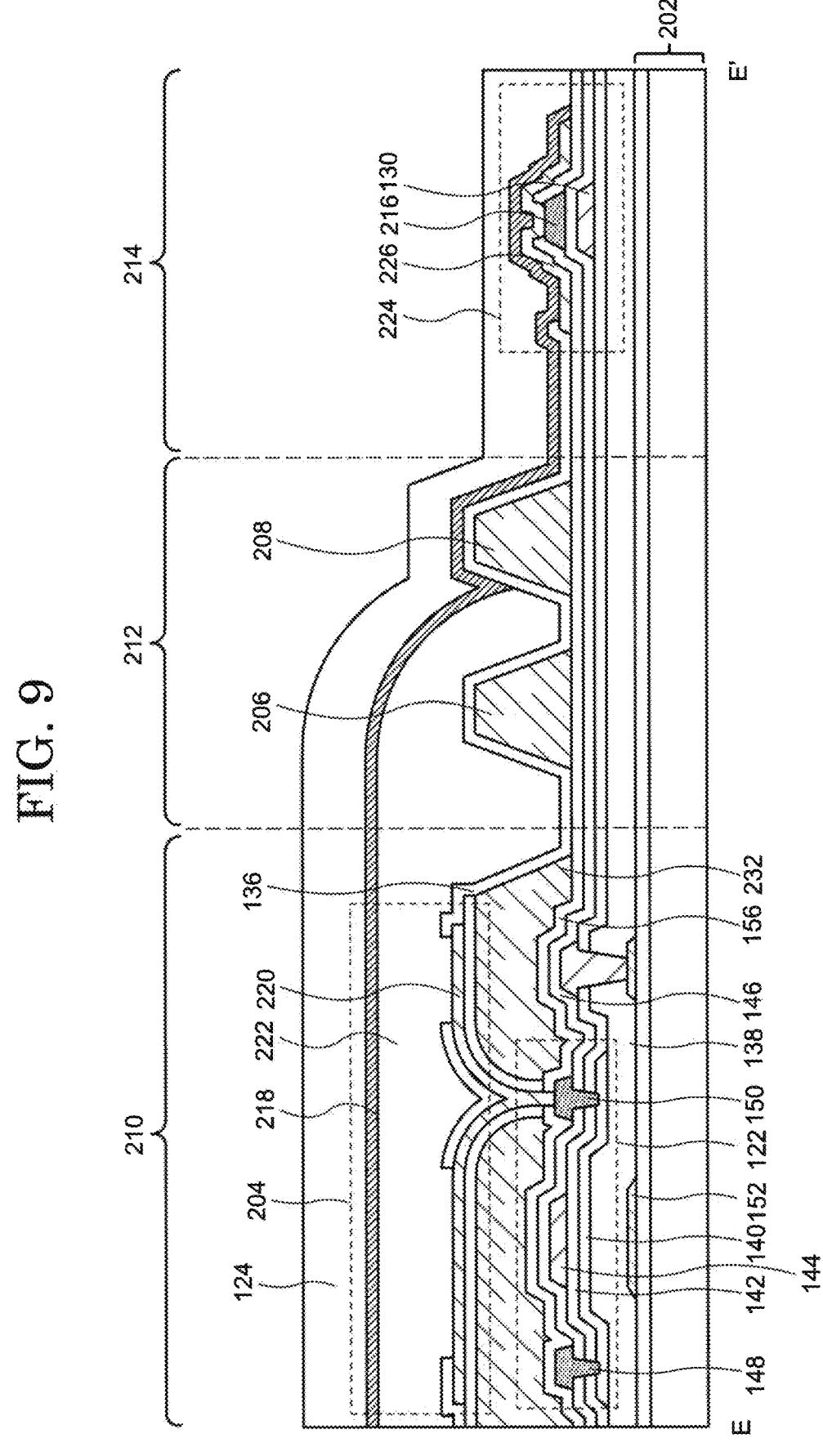
FIG. 9 is a schematic cross-sectional view of an organic photodiode device according to an embodiment of the present invention.

FIG. 9 is a schematic cross-sectional view taken along the chain line E-E' shown in FIG. 6. In FIG. 7, the organic layer 222 is selected inside the first rib 206, and there is no organic layer 222 between the first rib 206 and the second rib 208. However, the present embodiment is not limited to this configuration, and as shown in FIG. 9, the organic layer 222 may override the first rib 206 and cover the first rib 206. That is, the organic layer 222 may exist between a planarization film 232 and the first rib 206, and may exist between the first rib 206 and the second rib 208. The organic layer 222 may be provided on the first rib 206. Further, the organic layer 222 is provided inside the second rib 208 and partially covers the second rib 208. The upper electrode 218 is provided on the first rib 206, the second rib 208, and the common electrode 216. An organic layer 222 is provided between the upper electrode 218 and the first rib 206.

Even if the organic layer 222 overrides the rib adjacent to the photodiode 204, for example, the first rib 206 shown in FIG. 9, the rib located outside, for example, the second rib 208 shown in FIG. 9, dams the organic layer 222 and prevents the organic layer 222 from extending to the common electrode 216 or the contact pad 226 by forming the plurality of ribs such as the first rib 206 and the second rib 208 in the frame area 212. That is, the spread of the solution including the organic layer 222 and supplied by the coating method can be controlled, and the organic layer 222 can be selectively formed inside the second rib 208. As a result, the organic layer 222 can be prevented from being formed on the common electrode 216. Therefore, a process for exposing the contact pad 226 from the organic layer 222 is unnecessary, which contributes to simplification of the manufacturing process of the organic photodiode device 200.

In the organic photodiode device 200, the common electrode 216 or the contact pad 226 and a mounting electrode 234 are protected from the organic layer 222 of the photodiode 204 by a plurality of ribs, for example, the first rib 206 and the second rib 208, and the position and the shape of the organic layer 222 are precisely controlled. Therefore, by applying the present embodiment, the number of manufacturing steps of the organic photodiode device 200 can be reduced, and a reliable photodiode with a low cost can also be provided.

It is to be understood that the present invention provides other operational effects that are different from the operational effects provided by the aspects of the above-described embodiments, and also includes those that are obvious from the description of the present specification or that can be easily predicted by a person skilled in the art.

In the present specification, although the case of the organic photodiode device is mainly exemplified as the disclosed example, other application examples include other organic imaging devices, biological sensing devices, and the like. Further, the present invention can be applied to small to large organic photodiode devices without any particular limitation.

What is claimed is:

1. An organic photodiode device comprising:
    at least one photodiode including a first organic layer between a first electrode and a second electrode;
    a bank covering an edge of the first electrode; and
    a rib surrounding the at least one photodiode,
    wherein the second electrode overlaps the rib.

2. The organic photodiode device according to claim 1, further comprising a common electrode connecting to the second electrode,
    wherein the rib is located between the common electrode and the first organic layer.

3. The organic photodiode device according to claim 1, wherein the first organic layer has a polymer compound.

4. The organic photodiode device according to claim 1, wherein the at least one photodiode includes a plurality of photodiodes, and the first organic layer is shared by the plurality of photodiodes.

5. The organic photodiode device according to claim 1, wherein the first organic layer partly overlaps the rib.

6. The organic photodiode device according to claim 1, further comprising:
    a transistor having a semiconductor layer; and
    a planarization film between the first electrode and the semiconductor layer,
    wherein the rib and the planarization film include the same material.

7. An organic photodiode device comprising:
    at least one photodiode having a first organic layer between a first electrode and a second electrode;
    a bank covering an edge of the first electrode;
    a rib surrounding the first organic layer; and
    a partition surrounding the rib;
    wherein the second electrode is located on the rib.

8. The organic photodiode device according to claim 7, further comprising a common electrode connecting to the second electrode,
    wherein the rib is located between the common electrode and the first organic layer.

9. The organic photodiode device according to claim 8, further comprising a sealing layer on the common electrode,
    wherein the sealing layer covers the rib and is located within the partition.

10. The organic photodiode device according to claim 7, wherein the first organic layer has a polymer compound.

11. The organic photodiode device according to claim 7, wherein the at least one photodiode includes a plurality of photodiodes, and
    the first organic layer is shared by the plurality of photodiodes.

12. The organic photodiode device according to claim 7, wherein the rib and the partition include the same material.

13. The organic photodiode device according to claim 12, further comprising:
    a transistor having a semiconductor layer; and
    a planarization film between the first electrode and the semiconductor layer,
    wherein the rib and the planarization film include the same material.

14. An organic photodiode device comprising:
    at least one photodiode having a first organic layer between a first electrode and a second electrode;
    a bank covering an edge of the first electrode;
    a first rib surrounding the first organic layer; and
    a second rib surrounding the first rib;
    wherein the second electrode covers the second rib.

15. The organic photodiode device according to claim 14, further comprising a common electrode connecting to the second electrode,
    wherein the first rib is located between the common electrode and the first organic layer.

16. The organic photodiode device according to claim 14, wherein the first organic layer has a polymer compound.

17. The organic photodiode device according to claim 14, further comprising a second organic layer located between the first rib and the second rib,
    wherein a thickness of the second organic layer is smaller than a thickness of the first organic layer, and
    the first organic layer and the second organic layer include the same first material.

18. The organic photodiode device according to claim 14, wherein the at least one photodiode includes a plurality of photodiodes, and the first organic layer is shared by the plurality of photodiodes.

19. The organic photodiode device according to claim 14, wherein the first organic layer overlaps the first rib.

20. The organic photodiode device according to claim 14, further comprising:

a transistor having a semiconductor layer; and a planarization film between the first electrode and the semiconductor layer, wherein the first rib and the planarization film include the same second material.

* * * * *